(12) United States Patent
Ishiyama

(10) Patent No.: US 11,696,424 B2
(45) Date of Patent: Jul. 4, 2023

(54) POWER CONVERSION DEVICE

(71) Applicant: Mitsubishi Electric Corporation, Tokyo (JP)

(72) Inventor: Hiroto Ishiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 167 days.

(21) Appl. No.: 17/162,375

(22) Filed: Jan. 29, 2021

(65) Prior Publication Data
US 2022/0061185 A1 Feb. 24, 2022

(30) Foreign Application Priority Data

Aug. 18, 2020 (JP) .................................. 2020-137790

(51) Int. Cl.
*H05K 7/20* (2006.01)
*H05K 1/02* (2006.01)
(Continued)

(52) U.S. Cl.
CPC ............ *H05K 7/209* (2013.01); *H02M 7/003* (2013.01); *H05K 1/0203* (2013.01); *H05K 1/181* (2013.01);
(Continued)

(58) Field of Classification Search
CPC ...... H05K 7/209; H05K 1/0203; H05K 1/181; H05K 7/20409; H05K 2201/10053; H02M 7/003
(Continued)

(56) References Cited

U.S. PATENT DOCUMENTS 5,291,064 A * 3/1994 Kurokawa ............ H01L 23/473
257/E23.098
5,396,403 A * 3/1995 Patel ..................... H01L 23/433
257/713
(Continued)

FOREIGN PATENT DOCUMENTS

| JP | 10-65385 A | 3/1998 |
| JP | 2009-212236 A | 9/2009 |
| JP | 2014-241726 A | 12/2014 |

OTHER PUBLICATIONS

Communication dated Jun. 29, 2021, issued by the Japanese Patent Office in application No. 2020-137790.

*Primary Examiner* — Anatoly Vortman
(74) *Attorney, Agent, or Firm* — Sughrue Mion, PLLC; Richard C. Turner

(57) ABSTRACT

The power conversion device includes: a housing; an electric wiring board stored in the housing; a first heat generating component provided on the one surface of the electric wiring board; a second heat generating component which has a lower heat generation density than the first heat generating component and of which a protruding height from the electric wiring board is equal to or smaller than a protruding height of the first heat generating component, the second heat generating component being provided on the one surface of the electric wiring board; and a third heat generating component which has a lower heat generation density than the first heat generating component and of which a protruding height from the electric wiring board is greater than the protruding height of the first heat generating component, the third heat generating component being provided on another surface of the electric wiring board.

12 Claims, 9 Drawing Sheets

(51) Int. Cl.
*H05K 1/18* (2006.01)
*H02M 7/00* (2006.01)

(52) U.S. Cl.
CPC ............... *H05K 7/20409* (2013.01); *H05K 2201/10053* (2013.01)

(58) Field of Classification Search
USPC .......................................... 361/710
See application file for complete search history.

(56) References Cited

U.S. PATENT DOCUMENTS

| | | | | |
|---|---|---|---|---|
| 5,430,611 | A * | 7/1995 | Patel | H01L 23/467 257/E23.09 |
| 5,724,729 | A * | 3/1998 | Sherif | H01L 23/3737 361/705 |
| 5,981,310 | A * | 11/1999 | DiGiacomo | H01L 23/433 257/E23.09 |
| 6,065,530 | A * | 5/2000 | Austin | H05K 9/0049 174/16.3 |
| 6,082,443 | A * | 7/2000 | Yamamoto | F28D 15/046 174/15.2 |
| 6,269,866 | B1 * | 8/2001 | Yamamoto | F28D 15/0233 174/15.2 |
| 6,365,964 | B1 * | 4/2002 | Koors | H05K 7/20436 257/713 |
| 6,821,816 | B1 * | 11/2004 | Lawlyes | H01L 23/433 257/E23.09 |
| 7,023,699 | B2 * | 4/2006 | Glovatsky | H05K 7/20454 361/708 |
| 7,038,910 | B1 * | 5/2006 | Hodge | H05K 7/20445 361/752 |
| 9,901,009 | B2 * | 2/2018 | Sugita | H05K 7/205 |
| 10,383,253 | B1 * | 8/2019 | Mujcinovic | H05K 7/20409 |
| 10,542,640 | B1 * | 1/2020 | Leigh | H05K 7/20772 |
| 2004/0264114 | A1 * | 12/2004 | Hachiya | H05K 1/0203 361/676 |
| 2010/0025126 | A1 | 2/2010 | Nakatsu et al. | |
| 2012/0275205 | A1 | 11/2012 | Nakatsu et al. | |
| 2013/0128645 | A1 | 5/2013 | Nakatsu et al. | |
| 2015/0022974 | A1 | 1/2015 | Nakatsu et al. | |
| 2015/0289391 | A1 | 10/2015 | Nakatsu et al. | |
| 2017/0273218 | A1 * | 9/2017 | Stoermer | H01L 23/3675 |
| 2018/0124935 | A1 | 5/2018 | Nakatsu et al. | |
| 2019/0098777 | A1 | 3/2019 | Nakatsu et al. | |
| 2019/0254182 | A1 | 8/2019 | Nakatsu et al. | |
| 2021/0136948 | A1 * | 5/2021 | Tanaka | H05K 1/0203 |

* cited by examiner

POWER CONVERSION DEVICE

BACKGROUND OF THE INVENTION

1. Field of the Invention

The present disclosure relates to a power conversion device.

2. Description of the Background Art

In an electric vehicle having a motor as one of drive sources as in an electric automobile, a hybrid automobile, or the like, a plurality of power conversion devices are mounted. As the power conversion devices, there are a charger which converts commercial AC power to DC power to charge a high-voltage battery, a DC/DC converter for converting DC power of a high-voltage battery to voltage (e.g., 12 V) for a battery for an auxiliary device, an inverter for converting DC power from a battery to AC power for a motor, and the like.

In recent years, as electric vehicles are spreading, there has been an increasing demand of downsizing power conversion devices for reasons such as reducing a mounting space of power conversion devices provided in an electric vehicle, and further, cost reduction is required.

Meanwhile, in the power conversion devices used in electric vehicles, a large number of electric components such as semiconductor switching elements, various resistors, and aluminum electrolytic capacitors are used. Many of these electric components are heat generating components which generate heat by themselves when being energized. Due to heat generation by the heat generating components, a high-temperature environment arises inside the power conversion device. In addition, these heat generating components have different heights depending on their types, specifications, and the like. Therefore, for the power conversion device, it is required that heat of these heat generating components having different heights is efficiently dissipated to a housing and thus the heat generating components are cooled.

A structure of a metal case for efficiently dissipating heat of heat generating electric components having different heights is disclosed (see, for example, Patent Document 1). The metal case has, in an area corresponding to an area where an electric component is mounted on a printed board, a recess having a depth in accordance with the height dimension of the electric component. A bottom wall of the recess and the electric component are in direct contact with each other. Thus, heat of the electric component is directly transferred to the metal case and the metal case functions as a heat dissipation surface, whereby heat of the heat generating component can be efficiently dissipated to the metal case and the heat generating component can be cooled.

Patent Document 1: Japanese Laid-Open Patent Publication No. 10-65385

In Patent Document 1, since the bottom wall of the recess provided on the metal case and the electric component are in direct contact with each other, heat of the electric component can be efficiently dissipated to the metal case and the electric component can be cooled. However, since the recess is formed on the metal case in accordance with the area of the high-heat-generation electric component and the shape of the electric component, a plurality of recesses having different shapes are formed in a power conversion device provided with a plurality of high-heat-generation electric components. Therefore, there is a problem that the shape of the metal case is complicated and the thermal resistance in the surface direction of a surface on which the recess is provided on the metal case which is a housing becomes worse. In addition, since the shape of the metal case is complicated due to formation of the plurality of recesses, productivity of the power conversion device is deteriorated, thus causing a problem that it becomes difficult to reduce the cost for the power conversion device.

The electric components include an electric component that has a great height in the direction perpendicular to the mounting surface of the printed board, and a component that has a small height in the direction perpendicular to the mounting surface of the printed board and has a small projection area on the mounted surface. In a power conversion device in which these components are mounted on the same mounting surface, the depth of the recess on the metal case in an area of the electric component having a great height is small and the recess has a small shape, while the depth of the recess in an area of the electric component having a small height is great and the recess has a large shape. Therefore, the recesses in accordance with the shapes and the heights of the electric components are formed on the metal case, so that the shape in the surface direction of the metal case is complicated and the thermal resistance in the surface direction becomes worse. In order to avoid this, if a recess is formed to have a shape sufficiently larger in the surface direction of the metal case than the area of the electric component having a small height, the heights of electric components around the electric component having a small height are restricted by the recess, thus causing a problem that ease of layout on the printed board is deteriorated and it becomes difficult to downsize the power conversion device.

SUMMARY OF THE INVENTION

In view of the above, an object of the present disclosure is to obtain a power conversion device that enables size reduction and cost reduction while ensuring heat dissipation of heat generating components.

A power conversion device according to the present disclosure includes: a housing formed in a bottomed tubular shape and having a bottom wall made of metal, an inner surface of the bottom wall being a cooling surface; an electric wiring board formed in a plate shape and stored in the housing such that one surface of the electric wiring board is opposed to the cooling surface, the electric wiring board having a plurality of conductive portions; a first heat generating component provided on the one surface of the electric wiring board; a second heat generating component which has a lower heat generation density than the first heat generating component and of which a protruding height from the electric wiring board is equal to or smaller than a protruding height of the first heat generating component, the second heat generating component being provided on the one surface of the electric wiring board; and a third heat generating component which has a lower heat generation density than the first heat generating component and of which a protruding height from the electric wiring board is greater than the protruding height of the first heat generating component, the third heat generating component being provided on another surface of the electric wiring board.

In the power conversion device according to the present disclosure, the first heat generating component having the highest heat generation density is provided on the one surface of the electric wiring board which is opposed to the cooling surface of the housing, and the third heat generating component having a greater protruding height from the electric wiring board than the protruding height of the first heat generating component is provided on the other surface of the electric wiring board. Therefore, among the electric components provided on the one surface, the first heat generating component can be provided closest to the cooling surface, whereby heat dissipation of the first heat generating component having the highest heat generation density can be ensured. In addition, since the cooling surface is a flat surface and the structure of the housing is simplified, the power conversion device can be downsized. In addition, since the structure of the housing is simplified, productivity of the power conversion device is improved and thus the cost for the power conversion device can be reduced.

DETAILED DESCRIPTION OF THE PREFERRED EMBODIMENTS OF THE INVENTION

Figure 1:
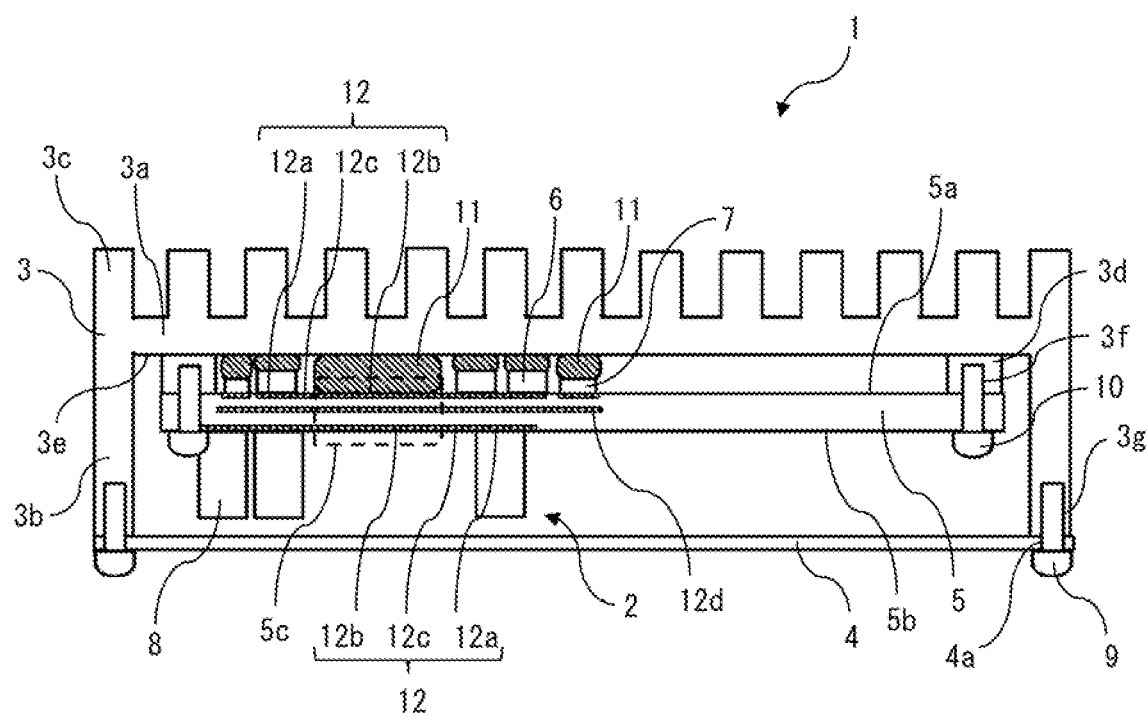
FIG. 1 is a sectional view schematically showing a power conversion device according to the first embodiment of the present disclosure.

Hereinafter, a power conversion device according to embodiments of the present disclosure will be described with reference to the drawings. In the drawings, the same or corresponding members or parts are denoted by the same reference characters.

First Embodiment

Figure 2:
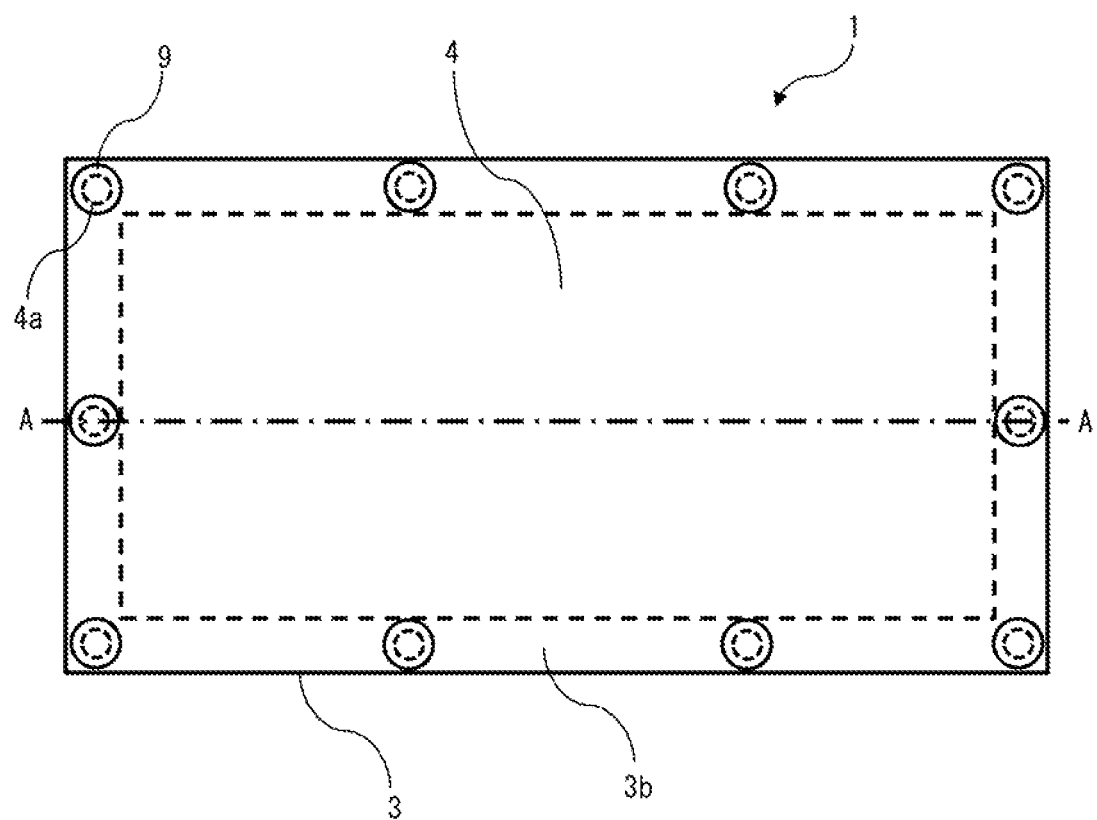
FIG. 2 is a plan view schematically showing the outer appearance of the power conversion device according to the first embodiment.
Figure 3:
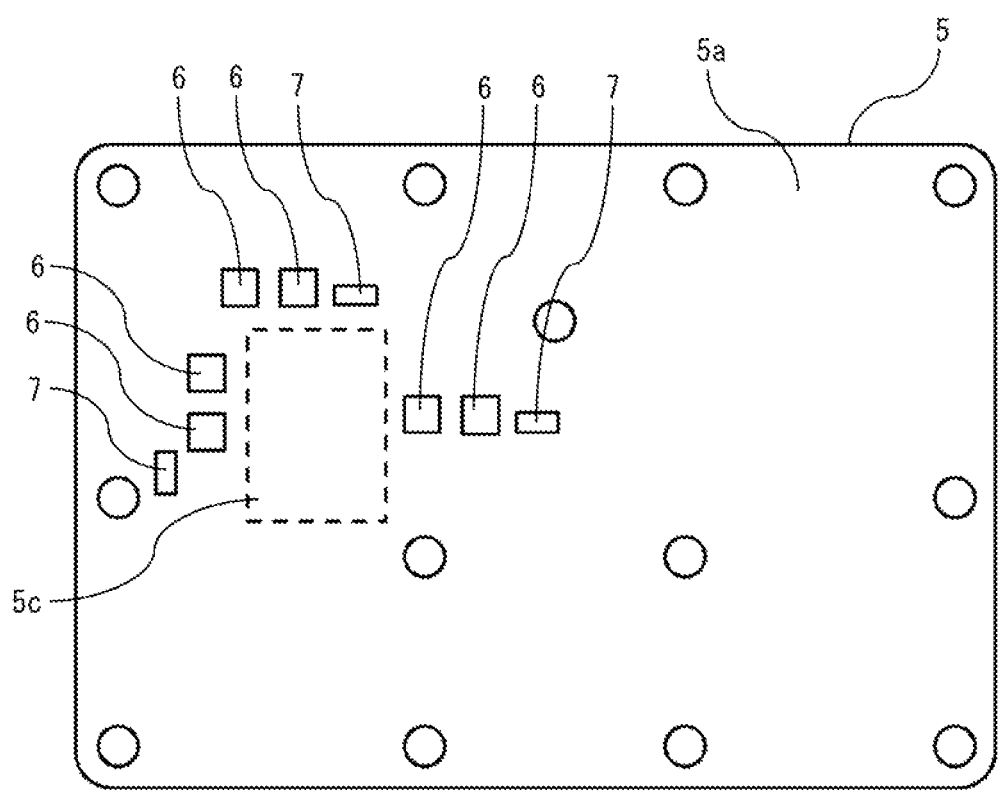
FIG. 3 is a plan view showing component arrangement on a printed board of the power conversion device according to the first embodiment.
Figure 4:
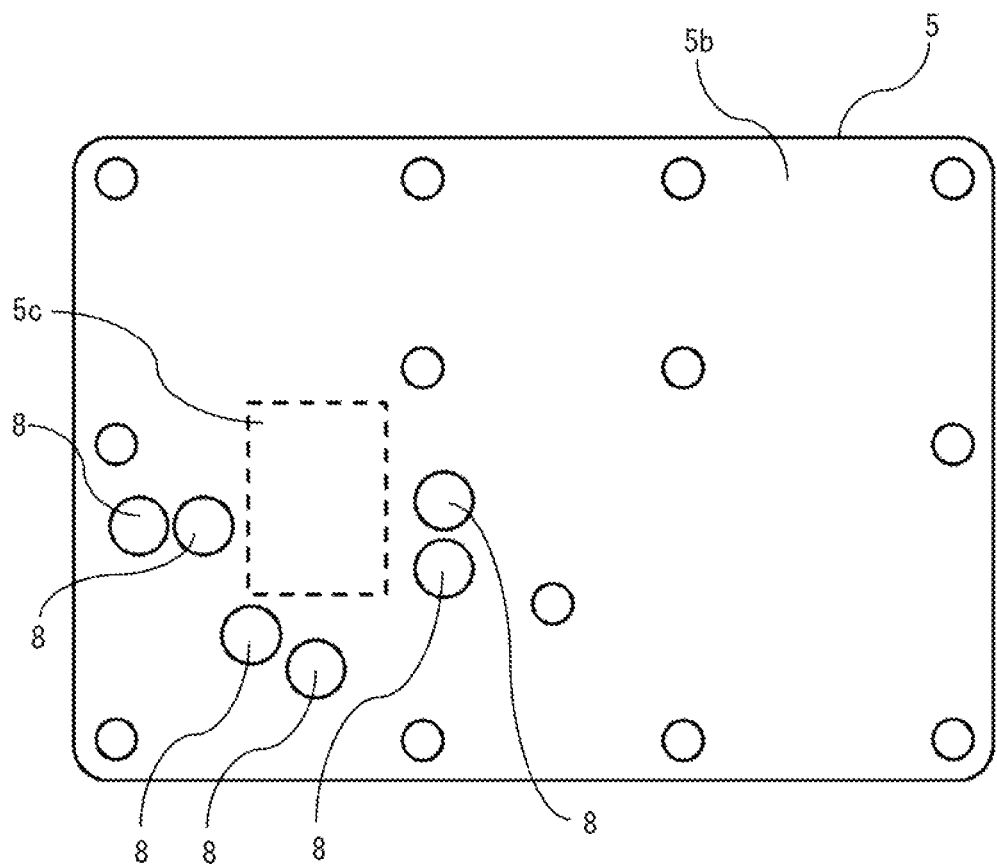
FIG. 4 is a plan view showing component arrangement on the printed board of the power conversion device according to the first embodiment.
Figure 5:
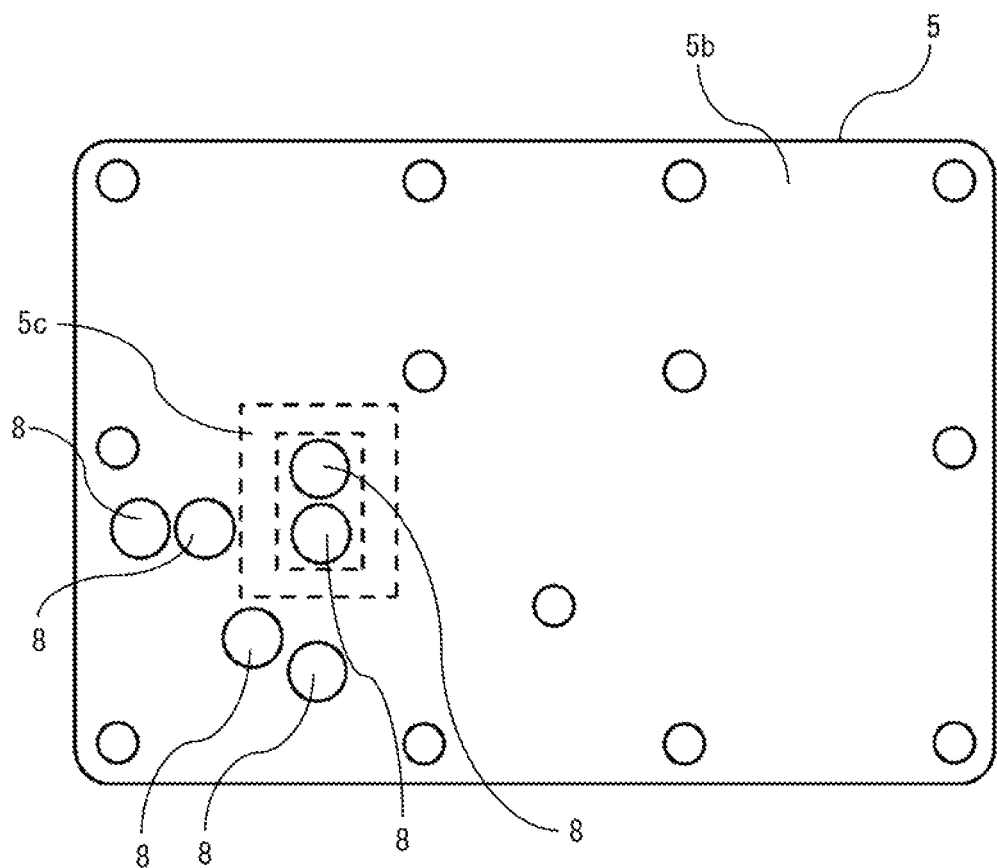
FIG. 5 is a plan view showing another component arrangement on the printed board of the power conversion device according to the first embodiment.
Figure 6:
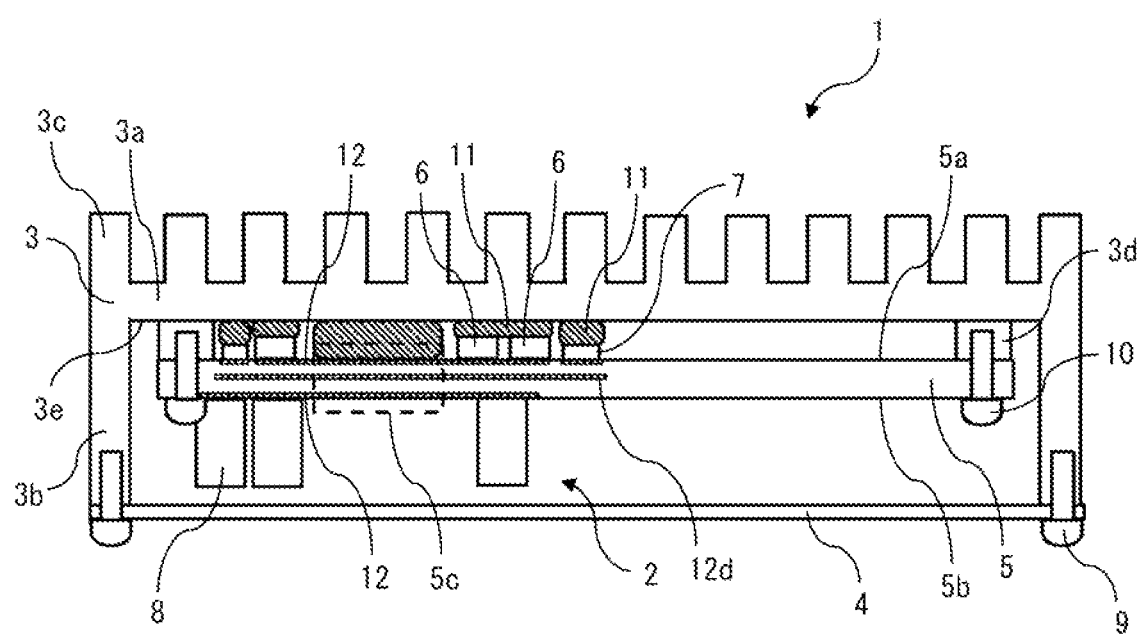
FIG. 6 is a sectional view schematically showing another power conversion device according to the first embodiment.

FIG. 1 is a sectional view schematically showing a power conversion device 1 according to the first embodiment, FIG. 2 is a plan view schematically showing the outer appearance on a cover 4 side of the power conversion device 1, FIG. 3 is a plan view showing arrangement of high-heat-generation components on a first mounting surface 5*a* of a printed board 5 of the power conversion device 1, FIG. 4 is a plan view showing arrangement of high-heat-generation components on a second mounting surface 5*b* of the printed board 5 of the power conversion device 1, FIG. 5 is a plan view showing another arrangement of high-heat-generation components on the second mounting surface 5*b* of the printed board 5 of the power conversion device 1 according to the first embodiment, and FIG. 6 is a sectional view schematically showing another power conversion device 1 according to the first embodiment. FIG. 1 is a sectional view of the power conversion device 1, taken at an A-A cross-section position in FIG. 2, and FIG. 6 is a sectional view of the other power conversion device 1, taken at a position equal to the A-A cross-section position in FIG. 2. The power conversion device 1 is mounted to a vehicle such as an electric automobile or a hybrid automobile having a motor as one of drive sources. The power conversion device 1 converts predetermined power (e.g., commercial AC power) to another predetermined power (e.g., DC power), and outputs the converted predetermined power.

<Configuration of Power Conversion Device 1>

The configuration of the power conversion device 1 will be described. As shown in FIG. 2, the power conversion device 1 includes the printed board 5 which is an electric wiring board having a power conversion unit 2 for performing power conversion, a housing 3 which stores the printed board 5 and dissipates heat to outside, and the cover 4 which covers an opening of the housing 3 and seals the inside of the housing 3. In the drawing, parts such as openings relevant to input and output of the power conversion device 1 are not shown.

The housing 3 is formed in a bottomed tubular shape, and an inner surface of a bottom wall 3*a* made of metal is a cooling surface 3*e*. In the present embodiment, the bottom wall 3*a* is formed in a rectangular plate shape. However, the shape of the bottom wall 3*a* is not limited thereto. A tubular outer peripheral wall 3*b* is provided so as to surround the cooling surface 3*e* and extend in the perpendicular direction from the cooling surface 3*e*. The cooling surface 3*e* has a plurality of bosses 3*d* having the same height and extending in the perpendicular direction from the cooling surface 3*e*. The boss 3*d* is a part for fixing the printed board 5 to the housing 3. The boss 3*d* has a screw hole 3*f* in an end surface thereof, and the printed board 5 is fixed to the boss 3*d* by a fastener 10 being fastened to the screw hole 3*f*. An outer surface of the bottom wall 3*a* has a plurality of fins 3*c*. With the fins 3*c* provided, the power conversion device 1 can promote heat dissipation from the housing 3 to outside. The outer peripheral wall 3*b* has a screw hole 3*g* in an end surface thereof, and the cover 4 is fixed to the outer peripheral wall 3*b* by a fastener 9 being fastened to the screw hole 3*g*.

The housing 3 is made of a metal material such as aluminum having high thermal conductivity, and is manufactured by, for example, aluminum die casting. In aluminum die casting, the bottom wall 3*a* and the outer peripheral wall 3*b* are formed by the same material. However, the bottom wall 3*a* and the outer peripheral wall 3*b* may be formed by different metal materials. In addition, the material of the outer peripheral wall 3*b* is not limited to metal. While the bottom wall 3*a* is made of metal, the outer peripheral wall 3*b* may be made of a material other than metal, e.g., a resin material.

The cooling surface 3*e* is a flat surface not having parts extending from the cooling surface 3*e*, except for the bosses 3*d*. In the present embodiment, the cooling surface 3*e* is formed to be a flat surface in the entire part except for the bosses 3*d*. However, the flat surface structure is not limited thereto. At least a part of the cooling surface 3*e* that is opposed to a part of the printed board 5 where a plate-shaped part 5*c*, semiconductor switching elements 6, resistors 7, and aluminum electrolytic capacitors 8 described later are arranged, may be a flat surface. The part of the printed board 5 where the plate-shaped part 5c, the semiconductor switching elements 6, the resistors 7, and the aluminum electrolytic capacitors 8 are arranged is a high-heat-generation area. If the cooling surface 3e opposed to the above area is a flat surface, heat dissipation in the surface direction of the cooling surface 3e can be ensured.

The cover 4 is opposed to the cooling surface 3e and covers the opening of the housing 3 surrounded by the outer peripheral wall 3b. The cover 4 is formed in a plate shape by a metal material such as aluminum, and is manufactured from sheet metal, for example. The cover 4 has a plurality of through holes 4a along the outer periphery. As shown in FIG. 2, the cover 4 is fixed to the outer peripheral wall 3b of the housing 3 by the fasteners 9 passing the through holes 4a represented by broken lines.

The printed board 5 is formed in a plate shape. As shown in FIG. 1, the printed board 5 is stored in the housing 3 such that, the first mounting surface 5a which is one surface thereof is opposed to the cooling surface 3e, and has a plurality of conductive portions 12. The second mounting surface 5b which is the other surface is opposed to the cover 4. The base body of the printed board 5 is made of a resin material such as epoxy resin having electric insulation property. The conductive portions 12 are formed at the first mounting surface 5a and the second mounting surface 5b, and inside the printed board 5. The conductive portion 12 formed inside the printed board 5 is an inner layer pattern 12d. The inner layer pattern 12d is shown as one layer in FIG. 1. However, without limitation thereto, for example, four layers of inner layer patterns 12d may be formed inside the printed board 5. In the case where four layers of inner layer patterns 12d are formed, the conductive portions 12 formed in the printed board 5 are composed of six layers, i.e., the conductive portions 12 at the front and back surfaces and the four layers of inner layer patterns 12d. These conductive portions 12 are electrically and thermally connected via through holes (not shown) at predetermined locations. On the first mounting surface 5a and the second mounting star face 5b, resist films (not shown) are formed at predetermined parts. The conductive portions 12 formed at the first mounting surface 5a and the second mounting surface 5b are kept in an insulated state and protected from the outside environment, at the parts where the resist films are provided.

<Power Conversion Unit 2>

The power conversion unit 2 includes a plurality of electric components. The electric components include the semiconductor switching elements 6, the resistors 7, the aluminum electrolytic capacitors 8, and other electric components (not shown) such as control components. The semiconductor switching elements 6, the resistors 7, the aluminum electrolytic capacitors 8, and the other electric components are mounted on the first mounting surface 5a or the second mounting surface 5b of the printed board 5. The semiconductor switching elements 6, the resistors 7, the aluminum electrolytic capacitors 8, and the other electric components are electrically connected via the conductive portions 12 provided to the printed board 5, whereby the power conversion unit 2 is formed. The semiconductor switching elements 6, the resistors 7, and the aluminum electrolytic capacitors 8 are high-heat-generation components, and the other electric components are low-heat-generation components.

The semiconductor switching elements 6 which are first heat generating components are arranged on the first mounting surface 5a of the printed board 5, and are mounted to the printed board 5 by soldering. The semiconductor switching elements 6 generate heat by themselves when energized, and have the highest heat generation density among the electric components included in the power conversion unit 2. The resistors 7 which are second heat generating components generate heat by themselves when energized, and have a lower heat generation density than the semiconductor switching elements 6, and the protruding height of the resistors 7 from the printed board 5 is equal to or smaller than the protruding height of the semiconductor switching elements 6. The resistors 7 are arranged on the first mounting surface 5a and are mounted to the printed board 5 by soldering. The aluminum electrolytic capacitors 8 which are third heat generating components generate heat by themselves when energized, and have a lower heat generation density than the semiconductor switching elements 6, and the protruding height of the aluminum electrolytic capacitors 8 from the printed board 5 is greater than the protruding height of the semiconductor switching elements 6. The aluminum electrolytic capacitors 8 are arranged on the second mounting surface 5b and are mounted to the printed board 5 by soldering. The protrusion heights of the other electric components arranged on the first mounting surface 5a from the printed board 5 are equal to or smaller than the protruding height of the semiconductor switching elements 6.

In this configuration, the aluminum electrolytic capacitors 8 having a greater protruding height than the protruding height of the semiconductor switching elements 6 are provided on the second mounting surface 5b. Therefore, among the electric components provided on the first mounting surface 5a, the semiconductor switching elements 6 having the highest heat generation density can be provided closest to the cooling surface 3e. Thus, heat dissipation of the semiconductor switching elements 6 which are heat generating components having the highest heat generation density can be ensured. The cooling surface 3e is a flat surface, and heat dissipation in the surface direction of the cooling surface 3e is not hampered by a recess or a protrusion. Thus, heat dissipation of the semiconductor switching elements 6 can be further ensured. In addition, since the cooling surface 3e is a flat surface, the structure of the housing 3 is simplified, whereby the power conversion device 1 can be downsized. In addition, since the structure of the housing 3 is simplified, productivity of the power conversion device 1 is improved and the cost for the power conversion device 1 can be reduced. The semiconductor switching elements 6 and the aluminum electrolytic capacitors 8 are separately provided on different mounting surfaces of the printed board 5, and they can be close to each other with the printed board 5 therebetween. Therefore, the conductive portions 12 for connecting these components can be simplified, whereby the printed board 5 can be downsized and the power conversion device 1 can be downsized.

<Heat Dissipation Member 11>

The power conversion device 1 includes heat dissipation members 11 between the cooling surface 3e, and the semiconductor switching elements 6 and the resistors 7. The semiconductor switching elements 6 and the resistors 7 are in contact with the cooling surface 3e via the heat dissipation members 11. The heat dissipation member 11 is, for example, a flexible solid body or an elastic body. Specifically, the heat dissipation member 11 is a semi-solid heat dissipation material having high thermal conductivity or a non-adhesive heat dissipation material curable from a liquid state into a sheet-like elastic body, and is, for example, a gap filler obtained by blending a predetermined amount of filler into a silicone material. Providing the heat dissipation members 11 can further improve heat dissipation of the semiconductor switching elements 6 and the resistors 7.

The members composing the power conversion device 1 repeatedly undergo thermal expansion and thermal contraction, whereby the distance between the cooling surface 3e and each component with the heat dissipation member 11 interposed therebetween varies. In the case where the heat dissipation member 11 is a liquid material, the heat dissipation member 11 is extruded from between each component and the cooling surface 3e due to the above distance variation, so that the heat dissipation member 11 might not be interposed at the original position. In the case where the heat dissipation member 11 is a flexible solid or an elastic body, the heat dissipation member 11 can be deformed to follow the distance variation, so that the heat dissipation member 11 is always in close contact with each component and the cooling surface 3e. Thus, heat dissipation of the semiconductor switching elements 6 and the resistors 7 which are heat generating components can be ensured.

In the present embodiment, the printed board 5 is shown as the electric wiring board. However, the electric wiring board is not limited to the printed board 5. The electric wiring board may be a resin molded component having, as a base body, bus bars of a conductive material such as a copper material or an aluminum material and covered with a resin having electric insulation property, for example. The heat generating components are mounted to the bus bars, and the bus bars and the heat generating components are connected by soldering, welding, or the like. In the case of using the printed board 5 as the electric wiring board, the height of the layered conductive portions 12 is greatly reduced as compared to the case of bus bars, and therefore the electric wiring board can be downsized and the power conversion device 1 can be downsized.

<Configuration of Component Arrangement>

Component arrangement of the high-heat-generation components on the first mounting surface 5a and the second mounting surface 5b of the printed board 5 will be described. The power conversion device 1 includes a plurality of semiconductor switching elements 6, a plurality of resistors 7, and a plurality of aluminum electrolytic capacitors 8. In the present embodiment, the power conversion device 1 includes six semiconductor switching elements 6, three resistors 7, and six aluminum electrolytic capacitors 8. The number of each component is not limited thereto, and may be increased or decreased from the above number, or may be one.

The printed board 5 has a partial specific plate-shaped part 5c in which no electric components are provided, at least at the first mounting surface 5a. The plate-shaped part 5c is a part enclosed by a broken line in FIG. 1, FIG. 3, and FIG. 4. As shown in FIG. 3, the semiconductor switching elements 6 and the resistors 7 are arranged around the plate-shaped part 5c on the first mounting surface 5a. In the present embodiment, with three electric components, i.e., two semiconductor switching elements 6 and one resistor 7, treated as a set, the sets of these components are arranged in a distributed manner in three directions around the plate-shaped part 5c provided in a rectangular shape on the first mounting surface 5a. For example, in the case where the size of the semiconductor switching element 6 is approximately 5×5 mm, the size of the plate-shaped part 5c is set to approximately 30×40 mm. The distance between the resistor 7 and the plate-shaped part 5c is equal to or greater than the distance between the semiconductor switching element 6 and the plate-shaped part 5c. As shown in FIG. 1, the power conversion device 1 has the heat dissipation member 11 between the cooling surface 3e and the plate-shaped part 5c on the first mounting surface 5a side, and the plate-shaped part 5c is in contact with the coding surface 3e via the heat dissipation member 11.

As shown in FIG. 4, the aluminum electrolytic capacitors 8 are arranged around the rectangular plate-shaped part 5c on the second mounting surface 5b. In the present embodiment, with two aluminum electrolytic capacitors 8 treated as a set, six aluminum electrolytic capacitors 8 are arranged in a distributed manner in three directions around the plate-shaped part 5c. In the present embodiment, the plate-shaped part 5c is provided in a rectangular shape on the first mounting surface 5a and the second mounting surface 5b. However, the shape of the plate-shaped part 5c is not limited thereto. The shape of the plate-shaped part 5c only has to be such a shape that allows high-heat-generation components to be arranged around the plate-shaped part 5c, and may be a circular shape, for example.

In the above configuration, one plate-shaped part 5c around which the high-heat-generation components are arranged, and the cooling surface 3e, are thermally connected via the heat dissipation member 11, so that a low-thermal-resistance heat dissipation path through the plate-shaped part 5c and the heat dissipation member 11 is formed between the cooling surface 3e and the high-heat-generation components. Thus, heat dissipation of the high-heat-generation components can be improved. In addition, with three electric components treated as a set, the sots of electric components are arranged in a distributed manner in three directions around the plate-shaped part. 5c on the first mounting surface 5a, whereby the plate-shaped part 5c having a small area can be provided as a single concentrated part. Thus, the printed board 5 can be downsized and the power conversion device 1 can be downsized. In addition, with two aluminum electrolytic capacitors 8 treated as a set, the sets of aluminum electrolytic capacitors 8 are arranged in a distributed manner in three directions around the plate-shaped part 5c on the second mounting surface 5b, whereby the plate-shaped part 5c having a small area can be provided as a single concentrated part. Thus, the printed board 5 can be downsized and the power conversion device 1 can be downsized. The distance between the resistor 7 and the plate-shaped part 5c is equal to or greater than the distance between the semiconductor switching element 6 and the plate-shaped part 5c. Therefore, even in the case where a space where the electric components are arranged on the first mounting surface 5a is limited, the heat dissipation path for the semiconductor switching elements 6 can be preferentially formed and thus heat dissipation of the semiconductor switching elements can be improved.

The semiconductor switching elements 6, the resistors 7, and the aluminum electrolytic capacitors 8 are thermally and electrically connected to component conductive portions 12a which are the conductive portions 12 that the printed board 5 has in the first mounting surface 5a and the second mounting surface 5b, at parts of the printed board 5 where the semiconductor switching elements 6, the resistors 7, and the aluminum electrolytic capacitors 8 are respectively provided. The plate-shaped part 5c has area conductive portions 12b which are the conductive portions 12, at the first mounting surface 5a and the second mounting surface 5b. The component conductive portions 12a and the area conductive portions 12b are thermally and electrically connected via connection conductive portions 12c which are the conductive portions 12. The component conductive portions 12a, the area conductive portions 12b, and the connection conductive portions 12c are thermally and electrically connected also to the inner layer pattern 12d via through holes.

In the above configuration, the high-heat-generation components are thermally connected to the plate-shaped part 5c via the conductive portions 12, whereby a lower-thermal-resistance heat dissipation path through the plate-shaped part 5c and the heat dissipation member 11 is formed between the cooling surface 3e and the high-heat-generation components. Thus, heat dissipation of the high-heat-generation components can be further improved.

The area conductive portion 12b, the connection conductive portion 12c, and the component conductive portion 12a to which the semiconductor switching element 6 is connected, are the conductive portions 12 which are exposed to outside at the first mounting surface 5a of the printed board 5 and on which no resist films are provided. By forming the conductive portions 12 exposed to outside, heat dissipation of the conductive portions 12 can be improved. In addition, since the area conductive portion 12b and the heat dissipation member 11 are in direct contact with each other, the heat dissipation path from the plate-shaped part 5c to the cooling surface 3e can be formed with a lower thermal resistance, whereby heat dissipation of the high-heat-generation components can be further improved.

In the present, embodiment, with two aluminum electrolytic capacitors 8 treated as a set, six aluminum electrolytic capacitors 8 are arranged in a distributed manner in three directions around the plate-shaped part 5c. However, arrangement of the aluminum electrolytic capacitors 8 is not limited thereto. The aluminum electrolytic capacitors 8 may be arranged in two directions or one direction around the plate-shaped part 5c, or as shown in FIG. 5, the aluminum electrolytic capacitors 8 may be arranged within the plate-shaped part 5c on the second mounting surface 5b. For sufficiently ensuring the heat dissipation path for the semiconductor switching elements 6 which are heat generating components having the highest heat generation density, no electric components are provided within the plate-shaped part 5c on the first mounting surface 5a. However, on the second mounting surface 5b, electric components can be provided within the plate-shaped part 5c. In the case where the aluminum electrolytic capacitors 8 are provided within the plate-shaped part 5c on the second mounting surface 5b, the printed board 5 can be downsized and the power conversion device 1 can be downsized.

In the present embodiment, the heat dissipation member 11 is provided between each high-heat-generation component and the cooling surface 3e. However, the arrangement configuration of the heat dissipation members 11 is not limited thereto. As shown in FIG. 6, at a part where the same high-heat-generation components (in FIG. 6, semiconductor switching elements 6) are provided close to each other, the heat dissipation members 11 may be integrated into one heat dissipation member 11 and the one heat dissipation member 11 may be provided between the cooling surface 3e and the two high-heat-generation components. In addition, all the heat dissipation members 11 may be integrated and provided. In the case where the heat dissipation members 11 are integrated and provided, the manufacturing process can be simplified and thus productivity can be improved. The heat dissipation member 11 may have insulating property. In the case where the heat dissipation member 11 has insulating property, the distance between the printed board 5 and the cooling surface 3e can be shortened, whereby the power conversion device 1 can be downsized.

In the present embodiment, with three electric components, i.e., two semiconductor switching elements 6 and one resistor 7, treated as a set, the sets of these components are arranged in a distributed manner in three directions around the plate-shaped part 5c provided in a rectangular shape. However, arrangement of the electric components is not limited thereto. The electric components may be arranged in two directions or one direction around the plate-shaped part 5c. In addition, the number of plate-shaped parts 5c is not limited to one, and a plurality of plate-shaped parts 5c may be provided in the printed board 5 and the electric components may be arranged around each of the plate-shaped parts 5c.

As described above, in the power conversion device 1 according to the first embodiment, the semiconductor switching elements 6 which are heat generating components having the highest heat generation density are provided on the first mounting surface 5a of the printed board 5 that is opposed to the cooling surface 3e of the housing 3, and the aluminum electrolytic capacitors 8 having a greater protruding height than the semiconductor switching elements 6 are provided on the second mounting surface 5b. Thus, among the electric components provided on the first mounting surface 5a, the semiconductor switching elements 6 can be provided closest to the cooling surface 3e, whereby heat dissipation of the semiconductor switching elements 6 having the highest heat generation density can be ensured. In addition, the cooling surface 3e is a flat surface and thus the structure of the housing 3 is simplified, whereby the power conversion device 1 can be downsized. In addition, since the structure of the housing 3 is simplified, productivity of the power conversion device 1 is improved and the cost for the power conversion device 1 can be reduced.

In the case where the semiconductor switching elements 6 and the resistors 7 are in contact with the cooling surface 3e via the heat dissipation members 11, heat dissipation of the semiconductor switching elements 6 and the resistors 7 can be further improved. In the case where one plate-shaped part 5c around which the high-heat-generation components are arranged on the printed board 5, and the cooling surface 3e, are thermally connected via the heat dissipation member 11, a low-thermal-resistance heat dissipation path through the plate-shaped part 5c and the hear, dissipation member 11 is formed between the high-heat-generation components and the cooling surface 3e. Thus, heat dissipation of the high-heat-generation components can be further improved. In the case where the component, conductive portion 12a and the area conductive portion 12b are thermally and electrically connected via the connection conductive portion 12c, the high-heat-generation component is thermally connected to the plate-shaped part 5c via the conductive portions 12. Thus, a lower-thermal-resistance heat dissipation path through the plate-shaped part 5c and the heat dissipation member 11 is formed between each high-heat-generation component and the cooling surface 3e, whereby heat dissipation of the high-heat-generation components can be further improved.

In the case where the distance between the resistor 7 and the plate-shaped part 5c is equal to or greater than the distance between the semiconductor switching element 6 and the plate-shaped part 5c, the heat dissipation path for the semiconductor switching element 6 can be preferentially formed, whereby heat dissipation of the semiconductor switching element 6 can be improved. In the case where the component conductive portion 12a, the area conductive portion 12b, and the connection conductive portion 12c are the conductive portions 12 exposed to outside at the first mounting surface 5a of the printed board 5, heat dissipation of the conductive portions 12 can be improved. In addition, the area conductive portion 12b and the heat dissipation member 11 are in direct contact, with each other, whereby the heat dissipation path from the plate-shaped part 5c to the cooling surface 3e can be formed with a lower thermal resistance. Thus, heat dissipation of the high-heat-generation components can be further improved. In the case where, with two semiconductor switching elements 6 and one resistor 7 treated as a set, the sets of these components are arranged in a distributed manner in three directions around the plate-shaped part 5c on the first mounting surface 5a, the plate-shaped part 5c having a small area can be provided as a single concentrated part in the printed board 5. Thus, the printed board 5 can be downsized and the power conversion device 1 can be downsized.

In the case where, with two aluminum electrolytic capacitors 8 treated as a set, the sets of aluminum electrolytic capacitors 8 are arranged in a distributed manner in three directions around the plate-shaped part 5c on the second mounting surface 5b, the plate-shaped part 5c having a small area can be provided as a single concentrated part. Thus, the printed board 5 can be downsized and the power conversion device 1 can be downsized. In the case where the aluminum electrolytic capacitor 8 is provided within the plate-shaped part 5c on the second mounting surface 5b, the printed board 5 can be downsized and the power conversion device 1 can be downsized. In the case where the heat dissipation member 11 is a flexible solid body or an elastic body, the heat dissipation member 11 can be deformed to follow variation in the distance between each component, and the cooling surface 3e, so that the heat dissipation member 11 is always in close contact with each component and the cooling surface 3e. Thus, heat dissipation of the semiconductor switching elements 6 and the resistors 7 which are heat generating components can be ensured.

In the case where the electric wiring board is a printed board, the height of the layered conductive portions 12 can be reduced, whereby the electric wiring board can be downsized and the power conversion device 1 can be downsized. In the case where the first heat generating component is the semiconductor switching element 6 and the third heat generating component is the aluminum electrolytic capacitor 8, the semiconductor switching element 6 and the aluminum electrolytic capacitor 8 are provided separately on different mounting surfaces of the printed board 5, and they can be close to each other with the printed board 5 therebetween. Thus, the conductive portions 12 for connecting these can be simplified, whereby the printed board 5 can be downsized and the power conversion device 1 can be downsized. In the case where the fins 3c are provided on the outer surface of the bottom wall 3a of the housing 3, heat dissipation from the housing 3 to outside can be promoted.

Second Embodiment

Figure 7:
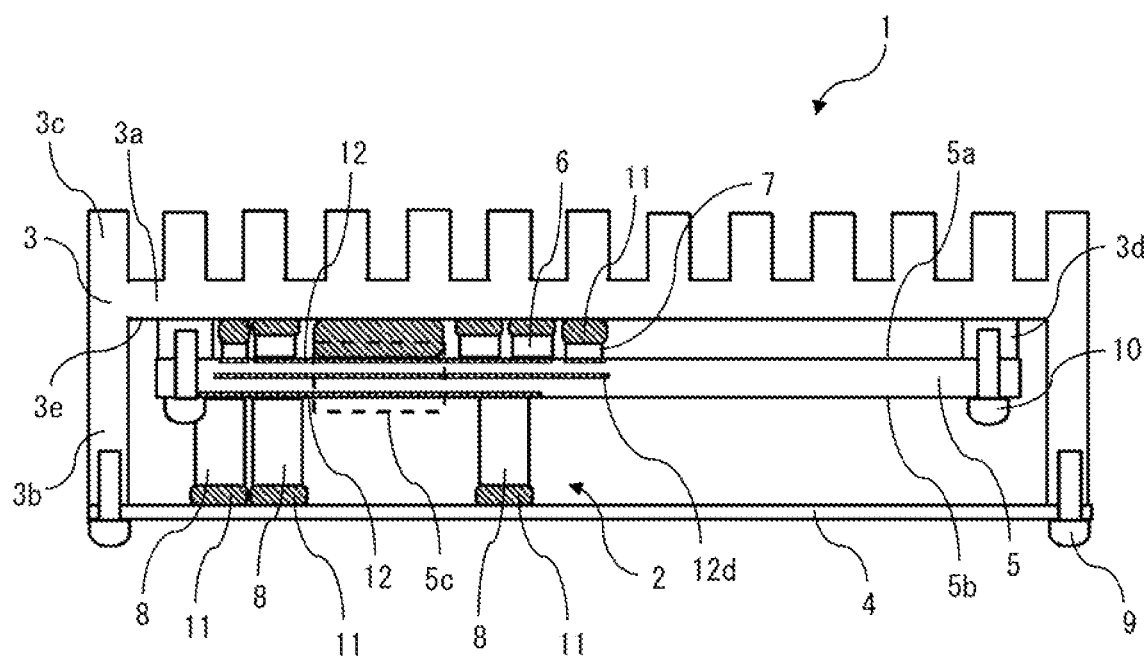
FIG. 7 is a sectional view schematically showing a power conversion device according to the second embodiment of the present disclosure.
Figure 8:
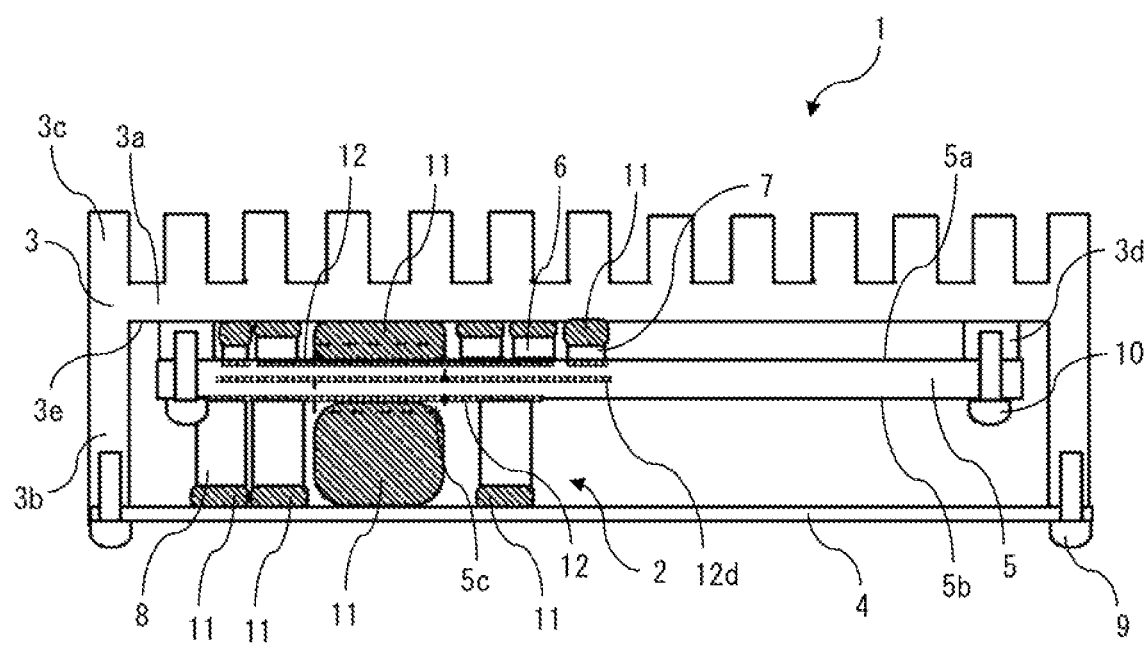
FIG. 8 is a sectional view schematically showing another power conversion device according to the second embodiment.
Figure 9:
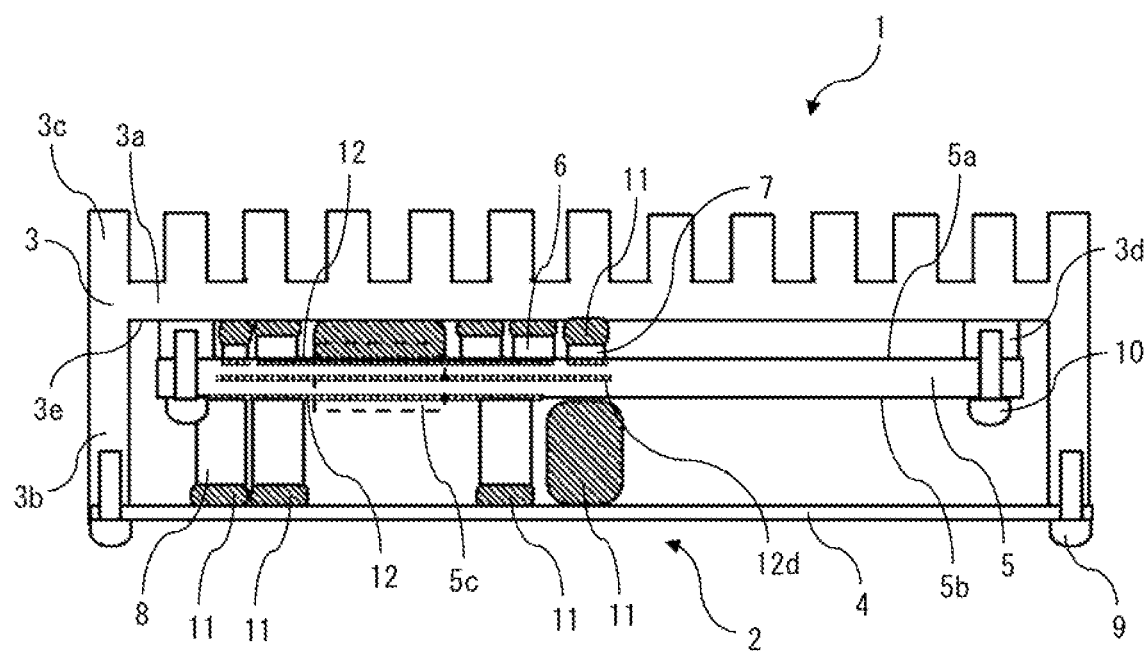
FIG. 9 is a sectional view schematically showing another power conversion device according to the second embodiment.

A power conversion device 1 according to the second embodiment of the present disclosure will be described. FIG. 7 is a sectional view schematically showing the power conversion device 1 according to the second embodiment, and FIG. 8 and FIG. 9 are sectional views schematically showing other power conversion devices 1 according to the second embodiment. FIG. 7, FIG. 8, and FIG. 9 are sectional views of the power conversion device 1 according to the second embodiment, taken at a position equal to the A-A cross-section position in FIG. 2. The power conversion device 1 according to the second embodiment is configured such that heat dissipation members 11 are additionally provided to the power conversion device 1 described in the first embodiment.

At least one of the aluminum electrolytic capacitor 8, the plate-shaped part 5c on the second mounting surface 5b side of the printed board 5, the part on the second mounting surface 5b side of the printed board 5 where the semiconductor switching element 6 is provided, and the part on the second mounting surface 5b side of the printed board 5 where the resistor 7 is provided, is in contact with the cover 4 via the heat dissipation member 11 provided between the at least one and the cover 4. The power conversion device 1 shown in FIG. 7 has the heat dissipation members 11 between the aluminum electrolytic capacitors 8 and the cover 4. The aluminum electrolytic capacitors 8 are in contact with the cover 4 via the heat dissipation members 11. In this configuration, heat generated from the aluminum electrolytic capacitors 8 is dissipated via the heat dissipation members 11 to the cover 4, whereby heat dissipation of the aluminum electrolytic capacitors 8 can be improved.

The power conversion device 1 shown in FIG. 8 has the heat dissipation members 11 between the aluminum electrolytic capacitors 8 and the cover 4, and between the plate-shaped part 5c on the second mounting surface 5b side and the cover 4. The aluminum electrolytic capacitors 8 and the plate-shaped part 5c on the second mounting surface 5b side are in contact with the cover 4 via the heat dissipation members 11. In this configuration, heat generated from the high-heat-generation components arranged around the plate-shaped part 5c is dissipated via the plate-shaped part 5c and the heat dissipation members 11 to the cooling surface 3e and the cover 4, whereby heat dissipation of the high-heat-generation components can be improved.

The power conversion device 1 shown in FIG. 9 has the heat dissipation members 11 between the aluminum electrolytic capacitors 8 and the cover 4, and between the cover 4 and the parts on the second mounting surface 5b side of the printed board 5 where the resistors 7 are provided. The aluminum electrolytic capacitors 8 and the parts on the second mounting surface 5b side of the printed board 5 where the resistors 7 are provided, are in contact with the cover 4 via the heat dissipation members 11. In this configuration, heat generated from the aluminum electrolytic capacitors 8 is dissipated via the heat dissipation members 11 to the cover 4, and heat generated from the resistors 7 is dissipated via the heat dissipation members 11 to the cooling surface 3e and the cover 4, whereby heat dissipation of the aluminum electrolytic capacitors 8 and the resistors 7 can be improved.

In the present embodiment, arrangement examples of the heat dissipation members 11 that are in contact with the cover 4 have been shown in FIG. 7 to FIG. 9. However, the arrangement configuration of the heat dissipation members 11 is not limited to the above examples. Another combination may be employed, or the heat dissipation member 11 may be provided between the cover 4 and the parts on the second mounting surface 5b side of the printed board 5 where the semiconductor switching elements 6 are provided.

As described above, in the power conversion device 1 according to the second embodiment, at least one of the aluminum electrolytic capacitor 8, the plate-shaped part 5c on the second mounting surface 5b side of the printed board 5, the part on the second mounting surface 5b side of the printed board 5 where the semiconductor switching element 6 is provided, and the part on the second mounting surface 5b side of the printed board 5 where the resistor 7 is provided, is in contact with the cover 4 via the heat dissipation member 11 provided between the at least one and the cover 4. Thus, heat generated from any of the semiconductor switching element 6, the resistor 7, and the aluminum electrolytic capacitor 8 is dissipated via the heat dissipation member 11 to the cover 4, whereby heat dissipation of the semiconductor switching element 6, the resistor 7, and the aluminum electrolytic capacitor 8 can be improved.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 power conversion device
2 power conversion unit
3 housing
3a bottom wall
3b outer peripheral wall
3c fin
3d boss
3e cooling surface
3f screw hole
3g screw hole
4 cover
4a through hole
5 printed board
5a first mounting surface
5b second mounting surface
5c plate-shaped part
6 semiconductor switching element
7 resistor
8 aluminum electrolytic capacitor
9 fastener
10 fastener
11 heat dissipation member
12 conductive portion
12a component conductive portion
12b area conductive portion
12c connection conductive portion
12d inner layer pattern

What is claimed is:

1. A power conversion device comprising:
a housing formed in a bottomed tubular shape and having a bottom wall made of metal, an inner surface of the bottom wall being a cooling surface;
an electric wiring board formed in a plate shape and stored in the housing such that one surface of the electric wiring board is opposed to the cooling surface, the electric wiring board having a plurality of conductive portions that are thermally and electrically conductive;
a first heat generating component provided on the one surface of the electric wiring board;
a second heat generating component which has a lower heat generation density than the first heat generating component and of which a protruding height from the electric wiring board is equal to or smaller than a protruding height of the first heat generating component, the second heat generating component being provided on the one surface of the electric wiring board;
a third heat generating component which has a lower heat generation density than the first heat generating component and of which a protruding height from the electric wiring board is greater than the protruding height of the first heat generating component, the third heat generating component being provided on another surface of the electric wiring board; and
a first heat dissipation member between the cooling surface and the first heat generating component, and a second heat dissipation member between the cooling surface and the second heat generating component, wherein
the first heat generating component and the second heat generating component are in contact with the cooling surface via the first heat dissipation member and the second heat dissipation member, respectively,
the electric wiring board has, at least at the one surface, a partial specific plate-shaped part on which no electric components are provided,
a third heat dissipation member is provided between the cooling surface and the partial specific plate-shaped part on the one surface side of the electric wiring board,
the first heat generating component and the second heat generating component are arranged around the partial specific plate-shaped part, and
the partial specific plate-shaped part is in contact with the cooling surface via the third heat dissipation member.

2. The power conversion device according to claim 1, wherein
the plurality of conductive portions comprise an area conductive portion, a component conductive portion, and a connection conductive portion,
the partial specific plate-shaped part has the area conductive portion,
the first heat generating component, the second heat generating component, and the third heat generating component are each thermally and electrically connected to the component conductive portion provided to the electric wiring board, at a part of the electric wiring board where each heat generating component is provided, and
the area conductive portion and the component conductive portion are thermally and electrically connected via the connection conductive portion.

3. The power conversion device according to claim 1, wherein a distance between the second heat generating component and the partial specific plate-shaped part is equal to or greater than a distance between the first heat generating component and the partial specific plate-shaped part.

4. The power conversion device according to claim 2, wherein
the connection conductive portion, the area conductive portion, and the component conductive portion to which the first heat generating component is connected, are the conductive portions exposed to outside at the one surface of the electric wiring board.

5. The power conversion device according to claim 1, further comprising a plurality of the first heat generating components, wherein the plurality of first heat generating components are arranged in a distributed manner around the partial specific plate-shaped part.

6. The power conversion device according to claim 1, further comprising a plurality of the third heat generating components, wherein
the plurality of third heat generating components are arranged in a distributed manner around the partial specific plate-shaped part.

7. The power conversion device according to claim 1, wherein
the third heat generating component is provided within the partial specific plate-shaped part on the other surface of the electric wiring board.

8. The power conversion device according to claim 1, further comprising a cover made of metal, the cover being opposed to the cooling surface and covering an opening of the housing surrounded by a tubular outer peripheral wall, wherein
at least one of the third heat generating component, the partial specific plate-shaped part on the other surface side of the electric wiring board, a part on the other surface side of the electric wiring board where the first heat generating component is provided, and a part on the other surface side of the electric wiring board where the second heat generating component is provided, is in contact with the cover via the first heat dissipation member, the second heat dissipation member, or the third heat dissipation member provided between the at least one and the cover.

9. The power conversion device according to claim 1, wherein
the third heat dissipation member is a flexible solid body or an elastic body.

10. The power conversion device according to claim 1, wherein
the electric wiring board is a printed board.

11. The power conversion device according to claim 1, wherein
the first heat generating component is a semiconductor switching element, and the third heat generating component is an aluminum electrolytic capacitor.

12. The power conversion device according to claim 1, further comprising a fin on an outer surface of the bottom wall of the housing.

* * * * *